US008724373B2

(12) United States Patent
Garg et al.

(10) Patent No.: US 8,724,373 B2
(45) Date of Patent: May 13, 2014

(54) APPARATUS FOR SELECTIVE WORD-LINE BOOST ON A MEMORY CELL

(75) Inventors: Manish Garg, Morrisville, NC (US); Michael ThaiThanh Phan, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/609,520

(22) Filed: Sep. 11, 2012

(65) Prior Publication Data

US 2013/0064006 A1   Mar. 14, 2013

Related U.S. Application Data

(60) Provisional application No. 61/533,730, filed on Sep. 12, 2011, provisional application No. 61/533,745, filed on Sep. 12, 2011.

(51) Int. Cl.
| | | |
|---|---|---|
| *G11C 8/08* | (2006.01) | |
| *G11C 8/16* | (2006.01) | |
| *G11C 8/12* | (2006.01) | |
| *G11C 7/08* | (2006.01) | |
| *G11C 5/06* | (2006.01) | |
| *G11C 11/419* | (2006.01) | |
| *G11C 11/408* | (2006.01) | |

(52) U.S. Cl.
CPC .. *G11C 8/08* (2013.01); *G11C 8/12* (2013.01); *G11C 8/16* (2013.01); *G11C 7/08* (2013.01); *G11C 5/063* (2013.01); *G11C 11/419* (2013.01); *G11C 11/4085* (2013.01)
USPC .................. 365/154; 365/230.05; 365/230.06

(58) Field of Classification Search
CPC .............. G11C 8/08; G11C 8/12; G11C 8/16; G11C 5/063; G11C 7/08; G11C 11/4085

USPC ................ 365/154, 155, 156, 230.05, 230.06
See application file for complete search history.

(56) References Cited

U.S. PATENT DOCUMENTS

| | | |
|---|---|---|
| 6,798,275 B1 | 9/2004 | Le et al. |
| 7,636,254 B2 | 12/2009 | Ehrenreich et al. |

(Continued)

FOREIGN PATENT DOCUMENTS

| | | |
|---|---|---|
| JP | 5120881 A | 5/1993 |
| JP | 9045082 A | 2/1997 |

OTHER PUBLICATIONS

Chung Y., et al., "Implementation of low-voltage static RAM with enhanced data stability and circuit speed", Microelectronics Journal, MacKintosh Publications Ltd. Luton, GB, vol . 40, No. 6, Jun. 1, 2009, pp. 944-951, XP026098456, ISSN: 0026-2692, DOI: 10.1016/J.MEJO.2008.11.063 [retrieved on Jan. 21, 2009].

(Continued)

*Primary Examiner* — Ly D Pham
(74) *Attorney, Agent, or Firm* — Nicholas J. Pauley; Peter Michael Kamarchik; Joseph Agusta

(57) ABSTRACT

Systems and methods for selectively boosting word-line (WL) voltage in a memory cell array. The method relies several embodiments to minimize energy costs associated with WL boost scheme. One embodiment generates a transient voltage boost rather than supply a DC voltage boost. The transient boost generation may be controlled on a cycle basis and can be disabled when the array is not accessed. Another embodiment allows the system to generate the transient voltage boost locally, near a WL driver and only during the cycles when it is needed. Localized boost voltage generation reduces the load capacitance that needs to be boosted to higher voltage. Another embodiment efficiently distributes the transient boost to the WL drivers.

40 Claims, 6 Drawing Sheets

(56) References Cited

U.S. PATENT DOCUMENTS

2002/0153939 A1 10/2002 Hirata
2010/0182823 A1 7/2010 Garg et al.
2011/0242879 A1 10/2011 Mair et al.

OTHER PUBLICATIONS

International Search Report and Written Opinion—PCT/US2012/054902—ISA/EPO—Nov. 27, 2012.
Takeda K., et al., "Multi-Step Word-Line Control Technology in Hierarchical Cell Architecture for Scaled-Down High-Density SRAMs", IEEE Journal of Solid-State Circuits, IEEE Service Center, Piscataway, NJ, USA, vol . 46, No. 4, Apr. 1, 2011, pp. 806-814, XP011351090, ISSN: 0018-9200, DOI: 10.1109/JSSC.2011.2109434.
Chandra, et al., "On the efficacy of write-assist techniques in low voltage nanoscale SRAMs," Design, Automation & Test in Europe Conference & Exhibition (Date), 2010, pp. 345-350.
Josh, et al., "A floating-body dynamic supply boosting technique for low-voltage sram in nanoscale PD/SOI CMOS technologies," 2007 ACM/IEEE International Symposium on Low Power Electronics and Design (ISLPED), Aug. 2007, pp. 8-13.
Raychowdhury, et al., "PVT-and-Aging Adaptive Wordline Boosting for 8T SRAM Power Reduction," 2010 IEEE International Solid-State Circuits Conference Digest of Technical Papers (ISSCC), 2010, pp. 352-353.
Sinangil, et al., "A 28nm high-density 6T SRAM with optimized peripheral-assist circuits for operation down to 0.6V,"2011 IEEE International Solid-State Circuits Conference Digest of Technical Papers (ISSCC), 2011, pp. 260-262.

US 8,724,373 B2

APPARATUS FOR SELECTIVE WORD-LINE BOOST ON A MEMORY CELL

CLAIM OF PRIORITY UNDER 35 U.S.C. §119

The present application for patent claims priority to Provisional Application No. 61/533,730 entitled "APPARATUS FOR SELECTIVE WORD-LINE BOOST ON A MEMORY CELL" filed Sep. 12, 2011 and Provisional Application No. 61/533,745 entitled "APPARATUS FOR SELECTIVE WORD-LINE BOOST ON A MEMORY CELL" filed Sep. 12, 2011, and assigned to the assignee hereof and hereby expressly incorporated by reference herein.

TECHNICAL FIELD

This disclosure relates to electronic memory operation and more specifically to an apparatus for a selective word-line boost on a memory cell.

BACKGROUND

Semiconductor memory devices include, for example, a static random access memory (SRAM) and a dynamic random access memory (DRAM). A DRAM memory cell generally includes one transistor and one capacitor, thereby providing a high degree of integration. DRAM, however, requires constant refreshing, which limits use of DRAM to computer main memory. An SRAM memory cell, by contrast, is bi-stable, meaning that it can maintain its state indefinitely, so long as an adequate power is supplied. SRAM also supports high speed operation, with lower power dissipation, which is useful for computer cache memory.

One example of an SRAM memory cell is a six transistor (6T) SRAM memory cell that includes six metal-oxide-semiconductor (MOS) transistors. As processes for fabricating MOS devices migrate to nanometer technologies, the use of conventional 6T SRAM cells within processor cache memories prohibits compliance with performance requirements. To meet these performance requirements, eight transistor (8T) SRAM cells are being used in place of the 6T SRAM cells. Use of an 8T SRAM cell may enable independent sizing of the devices on the read and write ports of the memory cell for supporting a lower minimum write voltage ($V_{min}$), while enabling a high performance read operation. Unfortunately, the use of 8T SRAM memory cells does not overcome the effect of weak bits, which are generally caused by the nanometer technology process variations on the read port devices for large size SRAM cache memory arrays.

In nanometer silicon technologies, the read/write margin for memory cells are diminished due to increased process variations. Various circuit assist techniques are commonly used to maintain scalability of the memory cell. The circuit assist techniques are also needed to improve the ($V_{min}$) of the memory cell which is essential to enable dynamic voltage scaling on circuits incorporating the memory cells. Very low dynamic voltage scaling (DVS) is critical of low power operation of mobile CPUs using these SRAM arrays.

One of the most effective and commonly used assist techniques to improve the read/write margin is to raise the word-line (WL) voltage relative to memory cell voltage. The word-line voltage can be raised by creating a high voltage island for the memory cell. The voltage island has high design cost in terms of area, performance and power due to need of level shifter and the need of additional high voltage supply. The higher voltage supply can also be generated on-chip using charge pump circuits, however they also cost significant area and power.

Thus there is a need for efficient circuit architecture to produce voltage boost on the memory word-line that has low energy overheads and allows very low voltage operation of the SRAM array.

SUMMARY

The disclosure relates to electronic memory operation and more specifically to an apparatus for a selective word-line boost on a memory cell. An embodiment of the disclosure provides a multiport static random access memory (SRAM) array that includes a control logic circuit to receive a transient boost voltage and a local word-line driver to apply the transient boost voltage to increase a selected portion of a word-line voltage following a word-line transition. An embodiment of the disclosure further provides a control logic circuit comprising a voltage generation circuit for each column of the SRAM memory array, the voltage generation circuit being configured to assert a transient boost voltage following a word-line transition. Another embodiment of the disclosure further provides a voltage generation circuit for each local word-line driver within each column of the SRAM memory array, wherein the voltage generation circuit is configured to assert a transient boost voltage following a word-line transition.

In yet another embodiment of the disclosure there is disclosed a method for selective word-line boost on a multiport SRAM memory array that includes receiving a clock signal to trigger boost timing operations, generating a selected transient boost voltage, providing a trigger signal to a bank array to trigger a bank array selection and distributing the selected transient boost voltage to the selected bank array. Other embodiments concern methods that including receiving the transient boost voltage at a control logic circuit and applying the transient boost voltage to increase a selected portion of a word-line voltage supplied by a local word-line voltage driver, following a word-line transition.

Another embodiment of the disclosure addresses a method for selective word-line boost on a multiport SRAM memory array that includes receiving a clock signal to trigger boost timing operations, generating a selected transient boost voltage, providing a trigger signal to a bank array to trigger bank array selection and distributing the selected transient boost voltage to a locally selected word-line driver.

Another embodiment of the disclosure relates to a multiport static random access memory (SRAM) array that includes means for receiving a clock signal to trigger boost timing operations, means for generating a selected transient boost voltage, means for providing a trigger signal to a bank array to trigger a bank array selection, and means for distributing the selected transient boost voltage to the selected bank array.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
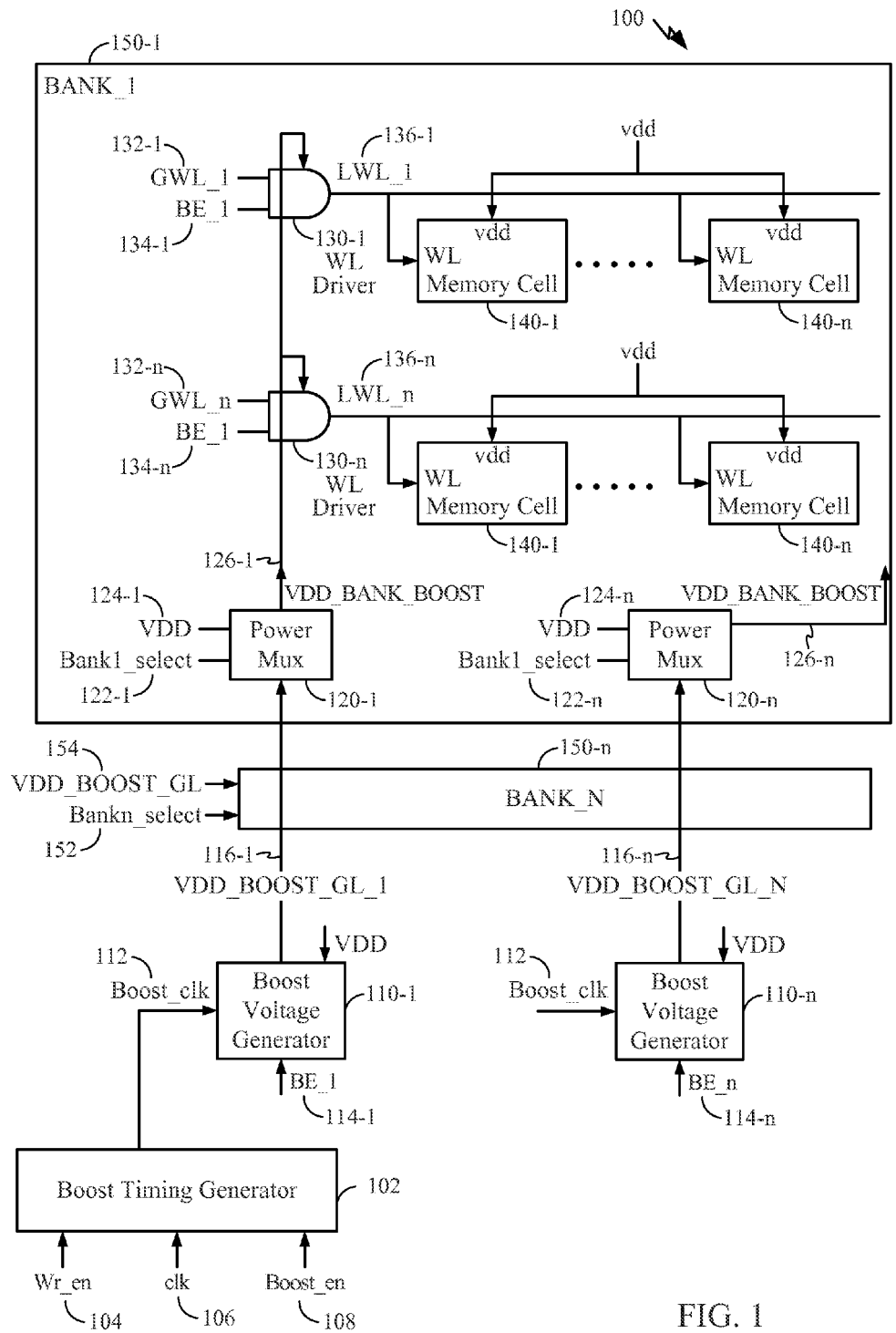
FIG. 1 is a circuit diagram illustrating a static random access memory (SRAM) cell that includes logic for a selective word-line boost according to an aspect of the present disclosure.

Eight-transistor (8T) static random access memory (SRAM) cells are commonly used in single rail CPU (central processing unit) designs. 8T SRAM cells are used in single rail CPU designs because they support dynamic voltage scaling (DVS) and fast read access. 8T SRAM cells also allow the read performance in a register file type design of L0/L1 (level 0 (L0)/level 1 (L1)) cache memories to track with a logic device performance. Even though an 8T read port can be independently sized for a high read current, the associated cost in terms of area and leakage becomes a significant part of the CPU budget for large size L0/L1 cache memory arrays.

A weak bit is a memory cell that has a relatively low current capacity as compared to a normal bit due to process/voltage/temperature (PVT) device variations. The cell current of a weak bit can affect and degrade the performance of an SRAM cache memory. In particular, due to the increased mismatch in nanometer technologies, a weak SRAM bit should have a significant timing margin for completing a read access. Also, a weak bit has higher voltage sensitivity due to a higher threshold voltage, resulting in a performance degradation that is higher than logic device performance degradation due to supply noise. The increased process variation also limits a minimum writability voltage ($V_{min}$) of the 8T cells that sets the overall minimum operation voltage or $V_{min}$ for singe rail CPUs.

In nanometer silicon technologies, the read/write margins for memory cells are diminishing due to increased process variations. Various circuit assist techniques are commonly used to maintain scalability of the memory cell. The circuit assist techniques are also needed to improve the $V_{min}$ of the memory cell which is important for enable dynamic voltage scaling (DVS) on circuits incorporating the memory cells. A low DVS is important for low power operation of a mobile CPU that uses SRAM arrays.

A mobile CPU may specify an aggressive power specification; therefore, lowering the 8T cell $V_{min}$ is important. In a mobile CPU that includes an 8T memory cell, with separate read and write ports, a cell write $V_{min}$ and a read current may be improved by boosting a word-line (WL) voltage. In particular, one technique to improve the read/write margin is to raise the word-line (WL) voltage relative to memory cell voltage. The word line voltage can be raised by creating a high voltage island for the memory cell. The voltage island, however, has a high design cost in terms of area, performance and power due to need of level shifters and the need of additional high voltage supply. The higher voltage supply can also be generated on-chip using charge pump circuits; however they also specify significant area and power. By raising the WL voltage, a write margin and a read current of the weak bit cell are significantly improved. Hence, there is an area and a power cost involved with implementing a boosting scheme. In one aspect of the present disclosure a sensor-driven, selective dynamic boosting of the read and write word-line voltage is described.

In one aspect of the present disclosure, an efficient circuit architecture is described for producing a voltage boost on a memory word-line. The proposed scheme may provide low energy overhead, while supporting a low voltage operation of an SRAM array. In this aspect of the present disclosure, a circuit architecture is described for selectively boosting a word-line voltage in a memory cell array. In one configuration, the circuit architecture may reduce an energy cost associated with a word-line boost by generating a transient voltage boost rather than a DC (direct current) voltage boost. The transient boost generation may be controlled on a cycle basis and can be disabled when the memory cell array is not being accessed.

In a further configuration, the circuit architecture selectively generates the transient voltage boost locally (e.g., near the word-line drivers) and only during the cycles when it is needed. A localized boost voltage generation may reduce the load capacitance to be boosted to a higher voltage. In this configuration, an efficient mechanism for distributing the transient boost voltage to the word-line drivers is described. A circuit architecture for selectively boosting a word-line of a cache memory array according to one aspect of the present disclosure is shown in FIG. 1.

Figure 2:
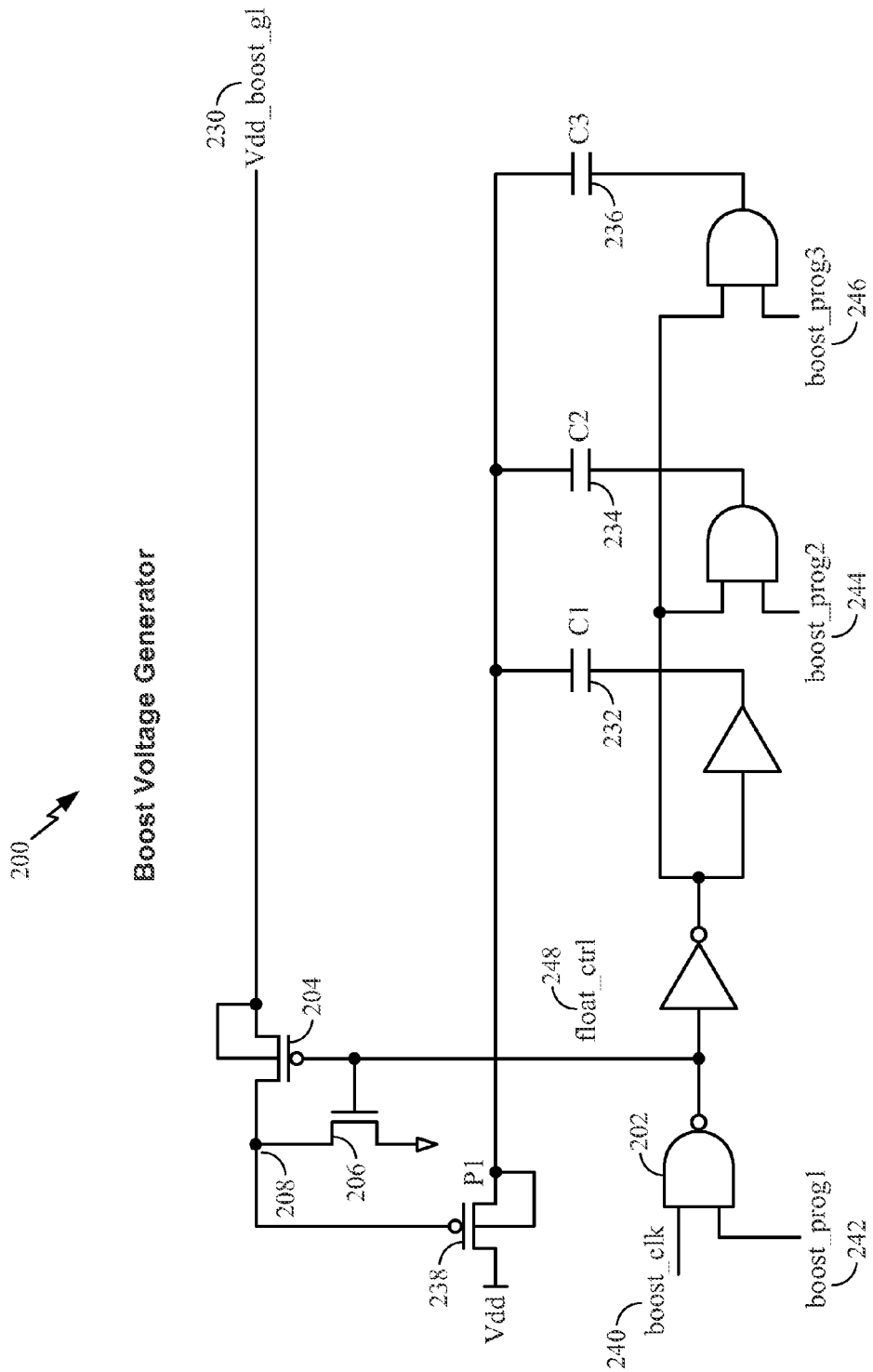
FIG. 2 is a circuit diagram further illustrating the voltage boost generator of FIG. 1 according to an aspect of the present disclosure.

FIG. 1 shows an architecture of a boost scheme for a write word-line according to one aspect of the present disclosure. A row boost voltage generator (BVG) 110 (110-1, . . . , 110-n) is used at the array level to produce a transient boosted voltage on the VDD_BOOST_GL signals 230, as shown in FIG. 2. In this configuration, a boost timing generator 102 synchronously triggers the BVGs 110 during a write cycle so that the boost is generated immediately following a word-line transition (i.e. a change in word-line voltage). Representatively, the boost timing generator 102 generates a boost_clk signal 112 according to a write enable (Wr_en) signal 104, a clock (clk) signal 106, and a boost enable (boost_en) signal 108. In this configuration, the boost timing generator 102 triggers the BVGs 110 according to a timing so that the boost is generated following a word-line transition. In this configuration, the BVGs 110 do not have to provide a charge for the initial word-line transitions since the boost_clk signal 112 causes the BVGs 110 to assert the boost voltage following the word-line transition.

As shown in FIG. 1, the boosted voltage is hierarchically distributed through power muxes (PM) 120 (120-1, . . . , 120-n) down to the local word-line drivers (LWLD) 130 (130-1, . . . , 130-n). In this configuration, the PM 120 connects the LWLDs 130 on the selected bank 150 (150, . . . , 150-n) to a boosted supply voltage VDD_BANK_BOOST signal 126 using a boost voltage VDD_BOOST_GL signal 116, a supply voltage VDD 124, and a bank select signal 122. The non-selected bank remains isolated from VDD_BOOST_GL signal 116, thereby reducing a load observed by the BVGs 110. For example, in one embodiment, bank n−1 may not be selected, and as such, the VDD_BOOST_GL signal 116-n−1 is also not selected so that it does not act as a driver to activate Power Mux 120-n−1. This helps reduce power consumption and circuit overload. This also enables the circuit to allocate voltage boosts only when and where necessary. The BVGs 110 are distributed along the data I/O (input/output) with one BVG 110 per LWLD column or per byte enable (BE). The BE can be write or read and can be used to control byte wide access to external memory, also known as laning. The BVGs 110 are tightly controlled by the signals used to access the memory. In particular, the BE signal 114 and the boost_clk signal 112 enable generation of a transient boost voltage VDD_BOOST_GL signal 116 for a selected byte/word. Thus, only the LWLDs 130 of the selected byte/word are boosted. This improves power efficiency, especially on storage unit cache memory arrays such as array 140 made of memory cells (140-1, . . . , 140-n).

During a write phase, the boosted supply voltage VDD_BANK_BOOST signal 126 and the local word line (LWL) 136 (136-1, . . . , 136-n) are floating, thus during a long write phase, they could leak down to a lower voltage. Due to transistor leakage, the word-line can change its voltage level to a lower voltage (i.e. float) and get into a critical voltage range where the word-line can cause bit-line failures in affected word-line segments. The leakage on the boosted supply is managed to guarantee a LWL boost of several nanoseconds at a low voltage to safely complete the write operation. As shown in FIG. 1, the LWLDs 130 (130-1, . . . , 130-n) drive memory cells 140 (140-1, . . . , 140-n) in response to a VDD_BANK_BOOST_1 signal 126 (126-1, . . . , 126-n), a global word-line (GWL) signal 132 (132-1, . . . , 132-n) and a byte enable (BE) signal 134 (134-1, . . . , 134-n). For bit-cell data integrity, the write bit-lines (WBLs) (not shown) are kept driven during the entire write phase, these WBLs are well-known for those who have skill of art. The read word-line boost scheme is similar except that the BVGs 110 directly drives the LWLD 130 without the PM 120 to ensure that boost voltage arrives at the LWL 136 just after the rise of local read word-line.

It can be understood that the leakage on the boosted supply nodes (such as VDD_BOOST_GL 116 and VDD_BANK_BOOST 126) and the LWL nodes (such as LWL 136) are kept low enough so that the boost voltage remains high for a certain minimum duration. This minimum duration is determined by the minimum time duration which is necessary to complete the read/write operation. The leakage is kept low by using lower leakage devices on the boosted supply. The boost voltage and LWL are triggered by a common clock signal (such as boost_clk 112) which starts the read/write operation. The timing of the boost and the LWL is tuned in the design such that boost is triggered just after LWL transition.

FIG. 2 is a circuit diagram further illustrating the voltage boost generator (BVG) 200 (110 of FIG. 1) according to an aspect of the present disclosure. In this configuration, the BVG 200 uses gate dielectric coupling capacitors C1-C3 (232, 234 and 236) for generating a boost voltage VDD_BOOST_GL 230. In one configuration, the voltage boost generator 200 can be programmed to adjust a boost level in the range of 10%-20% of the supply voltage (VDD) for reads and 25%-35% of the supply voltage (VDD) for writes. In this aspect of the present disclosure, the BVG 200 initially holds the VDD_BOOST_GL signal 230 at a VDD power supply voltage through P1 (pass transistor 238), and during a write phase, the VDD_BOOST_GL signal 230 is floated (e.g., using float_ctrl signal 248) and then coupled higher through capacitors C1-C3 232-236 through a boost_clk signal 240.

In this configuration, a level of the boost voltage VDD_BOOST_GL 230 is determined by programming a boost_prog1 signal 242, a boost_prog2 signal 244 and a boost_prog3 signal 246. In an exemplary embodiment, the boost voltage generator (BVG) 200 may contain three (3) programmable pins, such as boost_prog1 signal 242, boost_prog2 signal 244 and boost_prog3 signal 246 which can be controlled to determine how much boost is needed through multiple techniques. Such techniques may be sensor driven or state machine driven to ensure that a successful write is achieved (by controlling the boost). Adjusting the boost level during write and read operations involves manipulation of the supply voltage VDD by performing a Monte Carlo Circuit Analysis. It is known to those skilled in the art that a Monte Carlo circuit analysis is a class of computational algorithms that rely on repeated random sampling to compute the results. They are often used in computer simulations of physical and mathematical systems.

In another embodiment of BVG 200, there is provided a clock signal boost_clk signal 240 to one of the input ports of the NAND gate 202 to timely trigger the voltage manipulation to manage the boost. NAND gate 202 is also configured to receive a boost programming signal boost_prog1 signal 242. When at least one of the signals boost_clk signal 240 and boost_prog1 signal 242 is a logical LOW, pass transistor 204 is OFF and pull-down transistor 206 is ON which translates into having pass transistor 238 be ON. This sets the voltage signal VDD_BOOST_GL signal 230 to be the same value as the supply voltage Vdd and charges capacitors C1, C2, and C3 to Vdd value. The boost voltage is generated by the boost_clk signal 240. Boost_clk signal 240 is triggered only in the cycle when there is read or write operations. In one embodiment, the generation of boost voltage is tied to the read/write operation on a cycle basis. In many cases the memory operations are infrequent and so less power is dissipated in generating the boost voltage. This is an enhancement over prior art schemes wherein the boost voltage is not controlled on a cycle basis and BVG circuits are left active all the time.

It can be further understood that the word "float" in the BVG operation, as a status of a node in operation. When node goes to a logic value HIGH, such as node 208, the node VDD_BOOST_GL 230 becomes a floating output, which is subsequently boosted up to a higher voltage through the coupling of the gate dielectric coupling capacitors C1-C3 (232-236). The leakage on the boosted supply comes from all the devices connected to it. This includes device 204. This also includes the LWLDs and P5/P6 in FIG. 3 (discussed further below).

When the programming signal boost_prog1 signal 242 is pulled to a logical HIGH when the boost clock signal boost_clk signal 240 is also at a logic value HIGH, or asserted, pass transistor 204 is ON and pull-down transistor 206 is OFF, which in turn keeps transistor 238 OFF. This isolates the supply voltage Vdd from the output port labeled the voltage signal VDD_BOOST_GL signal 230 and allows it to float. Also, the terminal 232 of capacitor C1 is brought to a logic value HIGH through boost_clk signal 240, which in turn couples the VDD_BOOST_GL signal 230 to a value higher than Vdd.

Furthermore, with both boost_prog1 signal 242 and boost_clk signal 240 at a logical HIGH voltage, if the signal boost_prog2 signal 244 is set to a logical HIGH, then the terminal 234 of capacitor C2 is brought to a logic value HIGH through boost_clk signal, which also boosts the voltage at the output port supplying the voltage VDD_BOOST_GL signal 230. Similarly, if the signal boost_prog3 signal 246 is set to a logic value HIGH, then the terminal 236 of capacitor C3 is brought to a logic value HIGH, which also boosts the voltage at the output port supplying the voltage VDD_BOOST_GL 230.

It is seen that the programming signals boost_prog2 signal 244 and boost_prog3 signal 246 determine whether the capacitors C2 234 and C3 236 are also boosting the voltage VDD_BOOST_GL signal 230. In this way, adding additional capacitors and associated circuit components with additional programming signals will lead to a higher boost for the supply voltage. For example, BVG 200 can be programmed to adjust boost level 10%-20% of the supply voltage (VDD) for reads and 25%-35% of the supply voltage (VDD) for writes these programming signals can be used to adjust how much the supply voltage is boosted.

Figure 3:
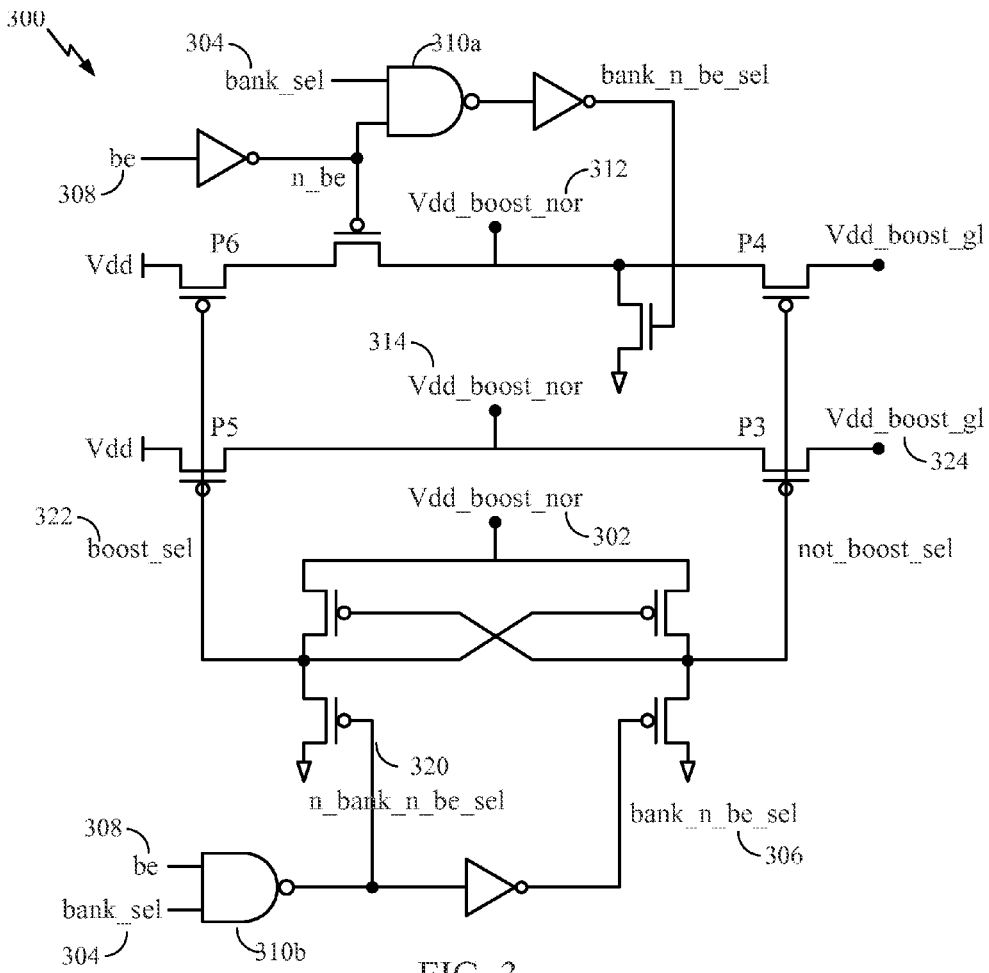
FIG. 3 is a circuit diagram illustrating a power multiplexor (PM) for controlling operation of a write word-line voltage boost according to an aspect of the present disclosure.

FIG. 3 illustrates a power multiplexor (PM) 300 according to one aspect of the present disclosure. In electronics, a multiplexer (or MUX) is a device that selects one of several analog or digital signals and forwards the selected input not a single line. Multiplexers are used to increase the amount of data that can be sent over the network within a certain amount of time and bandwidth. Multiplexers can be data selectors as well as power signals. Multiplexers that act as power selectors are called power multiplexers. Typically, a power multiplexer (power MUX) is used to enable seamless transition between two power supplies, or as applied in this case, enables the selection of specific power bank to enable the selection of specific boosted supply.

Looking at FIG. 3, and as mentioned above, the boosted voltage can be hierarchically distributed through power MUX (PM) 300, down to the local WL driver (LWLD), such as LWLD 130 (FIG. 1). In this configuration, The PM 300 connects the LWLD 130 supply to the boosted supply Vdd_boost signal 302 through P3-P4 on the selected bank, whereas in the non-selected bank, the LWDL are connected to VDD through P5-P6. Devices P3-P6 can be any type of PFET devices. To reduce or minimize leakage through PM 300 during a boost phase, level shifters are used on the signals controlling gates of P3-P6. Bank select signal allows for the selection of a bank (1-n) and byte enable signal (BE) allows for the selection to boost in the selected bank (1-n).

In one embodiment of the operation of PM 300, during a boost phase, the devices P5 and P6 are off. In order to keep them completely off during the boost phase, it is necessary to keep boost_sel signal 322 to be at the potential of VDD_BOOST_GL signal 324. This is achieved by using level shifters which convert the bank_sel signal 304 in VDD domain to boost_sel signal 322 in the VDD_BOOST_GL signal 324 domain. Without the use of the level shifters, the devices P5 and P6 would not be completely turned off during the boost phase and can cause increased leakage that will eventually dissipate the boosted voltage.

Looking further at FIG. 3, bank_sel signal 304 is the signal used to select what bank of the cache is used and bank_be_sel signal 306 is a resulting signal of logic AND function of the bank_sel signal 304 and the Byteline Enable (BE) signal 308. BE signal 308 is also used to select what byte or group of bits in a particular bank are used. PM 300 may implement the use of a number of NAND gates to achieve the appropriate boost voltage that is distributed to the Local Word Line Drivers (LWLD). In one exemplary embodiment illustrated in FIG. 3, PM 300 may incorporate two NAND logic gates 310a and 310b. NAND 310b is primarily used to select whether to boost or not boost the signal. NAND 310a is used to determine the output signal. The following table better illustrates the value logic system of input and output combinations of PM 300.

TABLE 1

Power MUX Input/Output logic

| BE | Bank_Sel | Vdd_boost_nor | Vdd_boost_inv |
|---|---|---|---|
| 0 | 0 | Floating | Vdd |
| 0 | 1 | 0 | Vdd |
| 1 | 0 | Vdd | Vdd |
| 1 | 1 | VDD_BOOST_GL | VDD_BOOST_GL |

As can be seen from table 1, when both inputs are at logic value 0 or LOW, the output is either floating (at Vdd_boost_nor signal 312) or Vdd (at Vdd_boost_inv signal 314). When BE signal 308 is value 0 and bank_sel signal 304 is a value 1, Vdd_boost_nor signal 312 is a value 0 and Vdd_boost_inv signal 314 is a value Vdd. When BE signal 308 is a value 1 and bank_sel signal 304 is a value 0, both outputs are at a value Vdd. When BE signal 308 is a value 1 and bank_sel signal 304 is also a value 1, both outputs have a value VDD_BOOST_GL. This illustrates that only when both inputs to the PM 300 are a value 1, or HIGH, does the output get boosted to VDD_BOOST_GL and the boosted voltage is then distributed to LWLD 130. In this case for example, power mux (PM) 300 reduces the loading on boost voltage generators, such as BVG 200, and thus improves the power efficiency. PM 300 is used primarily as a distributor of the boost voltage to LWLD drivers. PM 300 reduces the loading on BVGs and thus improves power efficiency.

Figure 4:
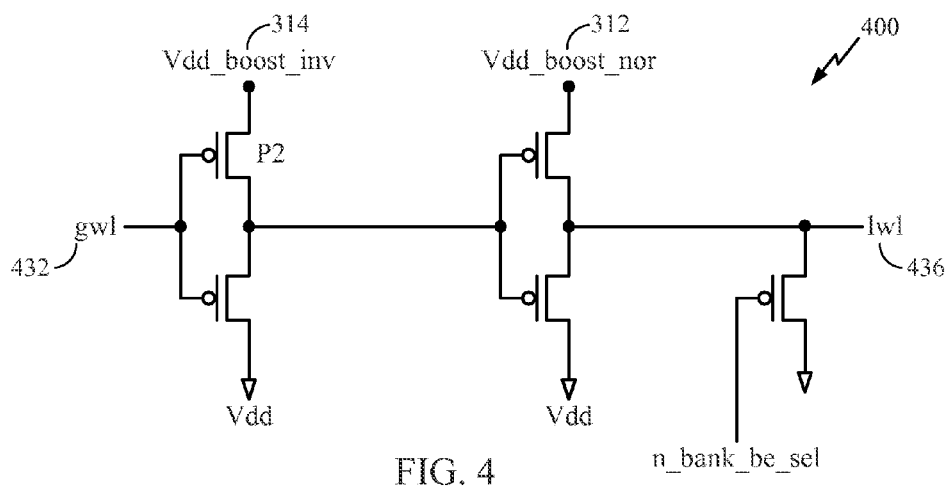
FIG. 4 is a diagram illustrating a local write word-line driver according to an aspect of the present disclosure.

FIG. 4 illustrates a local word-line driver (LWLD) 400 according to one aspect of the present disclosure. In this configuration, the LWLD 400 includes an inverter followed by a NOR2 stage with byte enable gating where both are connected to the boosted supply. One series pMOS in the NOR is shared across the column and is merged in the PM 300 to save area. Explicit level shifting is avoided in the LWLD 400 for area efficiency. VDD_BANK_BOOST signal 126 (shown in FIG. 1) represents the boosted output voltage signal from the power mux 120 (shown in greater detail as PM 300). Thus, as illustrated in the above discussion of FIG. 3, the VDD_BANK_BOOST signal 126 translates into two output signals (Vdd_boost_nor signal 312 and Vdd_boos_inv signal 314). On non-selected rows, the global word-line (GWL) signal 432 remains at 0, preventing increased leakage through the LWLDs 400 during a boosted write phase. As GWL 432 begins to increase in value, rising to a value of Vdd, there is exists a resulting increase in leakage through P2. However, the increased leakage is small as only one row is selected per bank.

The body of P2 device in LWLD 400 is connected to the regular supply voltage to reduce load on the boosted supply. As indicated above, the PM 300 connects the LWLD 400 supply to the boosted supply 310 through P3-P4 on the selected bank, whereas in the non-selected bank, the LWDL 400 are connected to VDD through P5-P6. To reduce or minimize leakage through PMs 300 during a boost phase, explicit level shifters are used on the signals controlling gates of P3-P6.

In yet another embodiment, during a write phase, the boosted supply voltage VDD_BANK_BOOST_1 (represented by Vdd_boost_inv signal 314 and Vdd_boost_nor signal 312) and the local word-line (LWL) 436 are floating, thus during a long write phase, they could leak down to a lower voltage. Due to transistor leakage, the word-line can change its voltage level to a lower voltage (i.e. float) and get into a critical voltage range where the word-line can cause bit-line failures in affected word-line segments. The leakage on the boosted supply is managed to guarantee a LWL 436 boost of several nanoseconds at a low voltage to safely complete the write operation.

In yet another embodiment shown in FIG. 4, the LWLDs 400 drive memory cells (not shown) in response to a VDD_BANK_BOOST_1 signal represented by Vdd_boost_inv signal 314 and Vdd_boost_nor signal 312), a global word-line (GWL) signal 432 and a byte enable signal (BE) (n_bank_be_sel) signal 320. The byte enable signal n_bank_be_sel 320 is also the output signal of the NAND 310b device (shown in FIG. 3) utilized to select whether to enable boost through the power mux 300 or not. For bit-cell data integrity, the write bit-lines (WBLs) (not shown) are kept driven during the entire write phase, these WBLs are well-known for those who have skill of art. The leakage on the boosted supply nodes and the LWL nodes are kept low enough that the boost voltage remains at logic value HIGH for a certain minimum duration. This minimum duration is determined by the minimum time duration which is necessary to complete the read/write operation. The leakage is kept low by using lower leakage devices on the boosted supply. The boost and LWL are triggered by a common clock signal which starts the read/write operation. The timing of the boost and LWL is turned in the design such that boost is triggered just after LWL transition.

Figure 5:
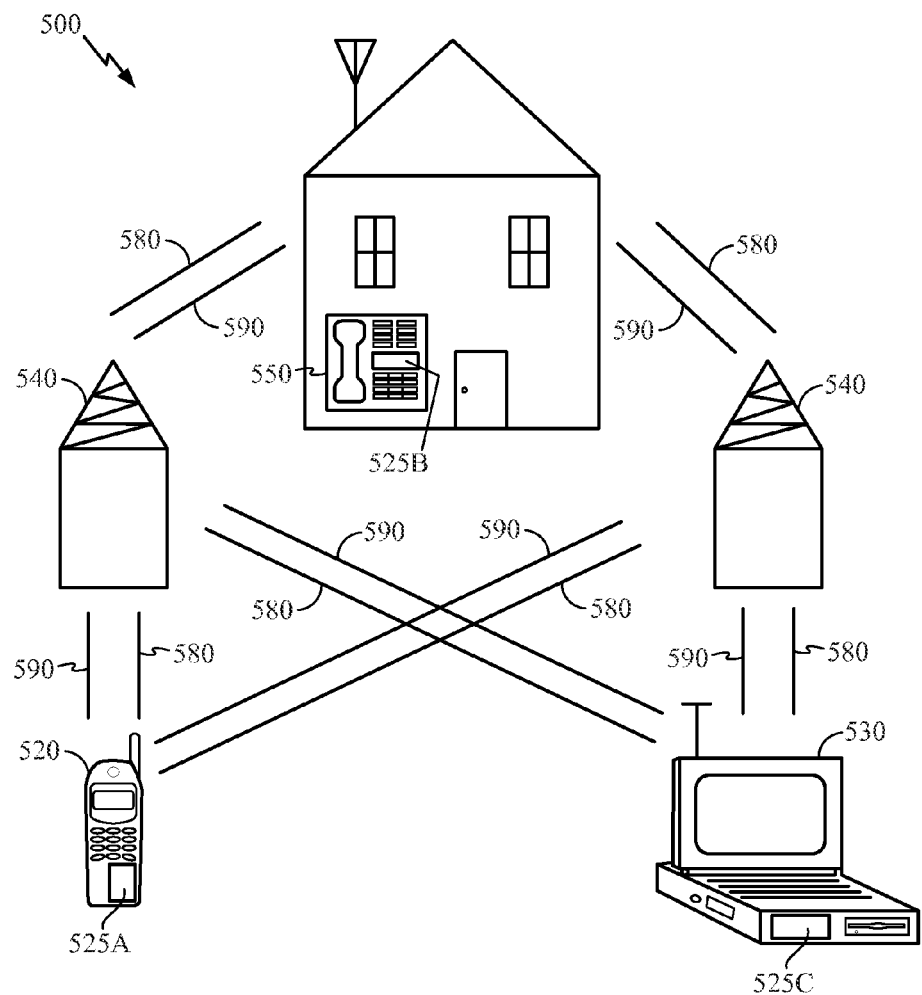
FIG. 5 is a block diagram showing an exemplary wireless communication system in which aspects of the disclosure may be advantageously employed.

FIG. 5 shows an exemplary wireless communication system 500 in which an embodiment of the disclosure may be advantageously employed. For purposes of illustration, FIG. 5 shows three remote units 520, 530, and 550 and two base stations 540. It will be recognized that typical wireless communication systems may have many more remote units and base stations. Remote units 520, 530, and 550 include adaptive write word line boosting circuitry 525A, 525B, and 525C, respectively, which are embodiments of the disclosure as discussed further below. FIG. 5 shows forward link signals 580 from the base stations 540 and the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any device which includes adaptive write word line boosting circuitry.

Figure 6:
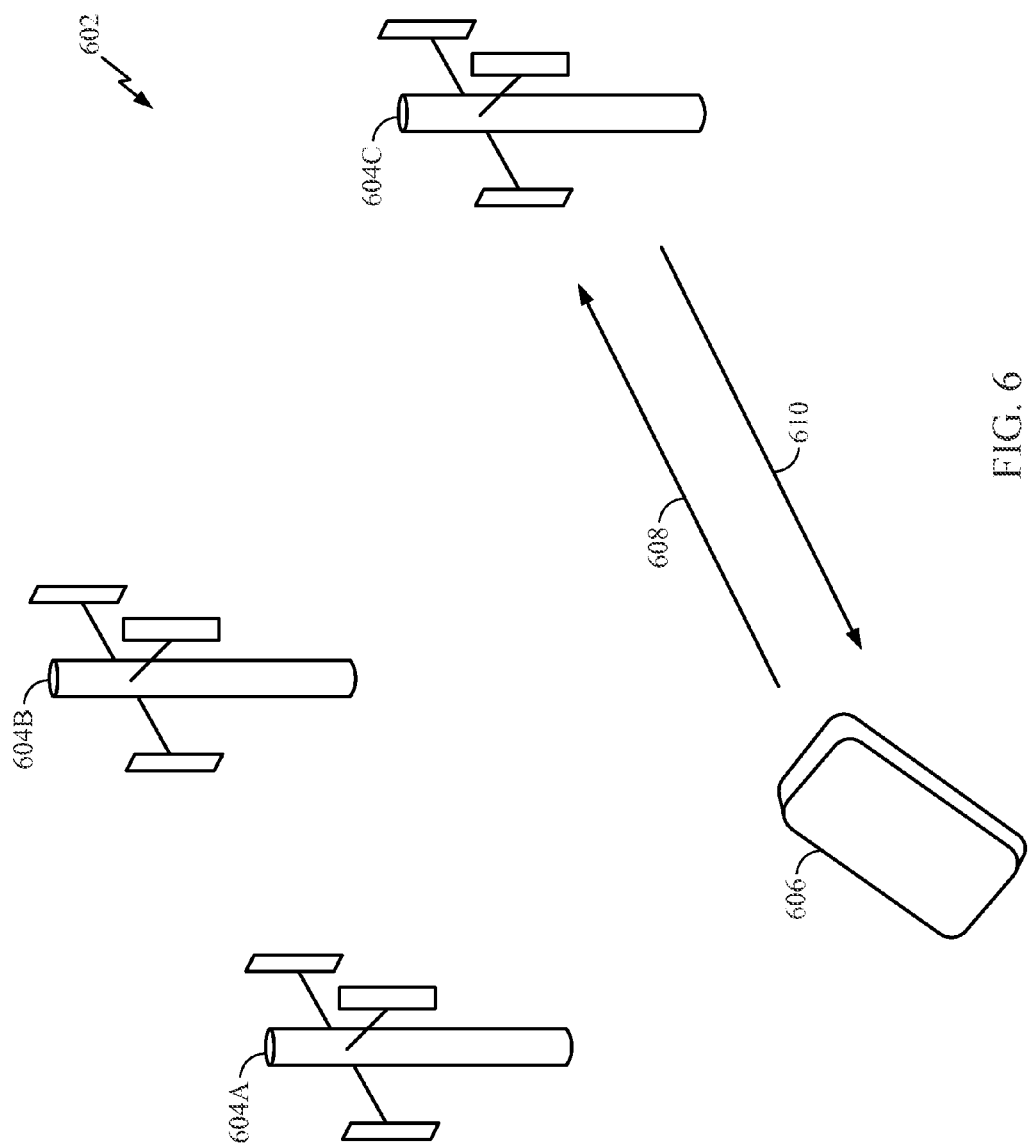
FIG. 6 illustrates a cellular phone network in which an embodiment may find application.

Embodiments may find widespread application in numerous systems, such as a cellular phone network. For example, FIG. 6 illustrates cellular phone network 602 comprising Base Stations 604A, 604B, and 604C. FIG. 6 shows a communication device, labeled 606, which may be a mobile cellular communication device such as a so-called smart phone, a tablet, or some other kind of communication device suitable for a cellular phone network. Communication Device 606 need not be mobile. In the particular example of FIG. 6, Communication Device 606 is located within the cell associated with Base Station 604C. Arrows 608 and 610 pictorially represent the uplink channel and the downlink channel, respectively, by which Communication Device 606 communicates with Base Station 604C.

Embodiments may be used in data processing systems associated with Communication Device 606, or with Base Station 604C, or both, for example. FIG. 6 illustrates only one application among many in which the embodiments described herein may be employed.

Figure 7:
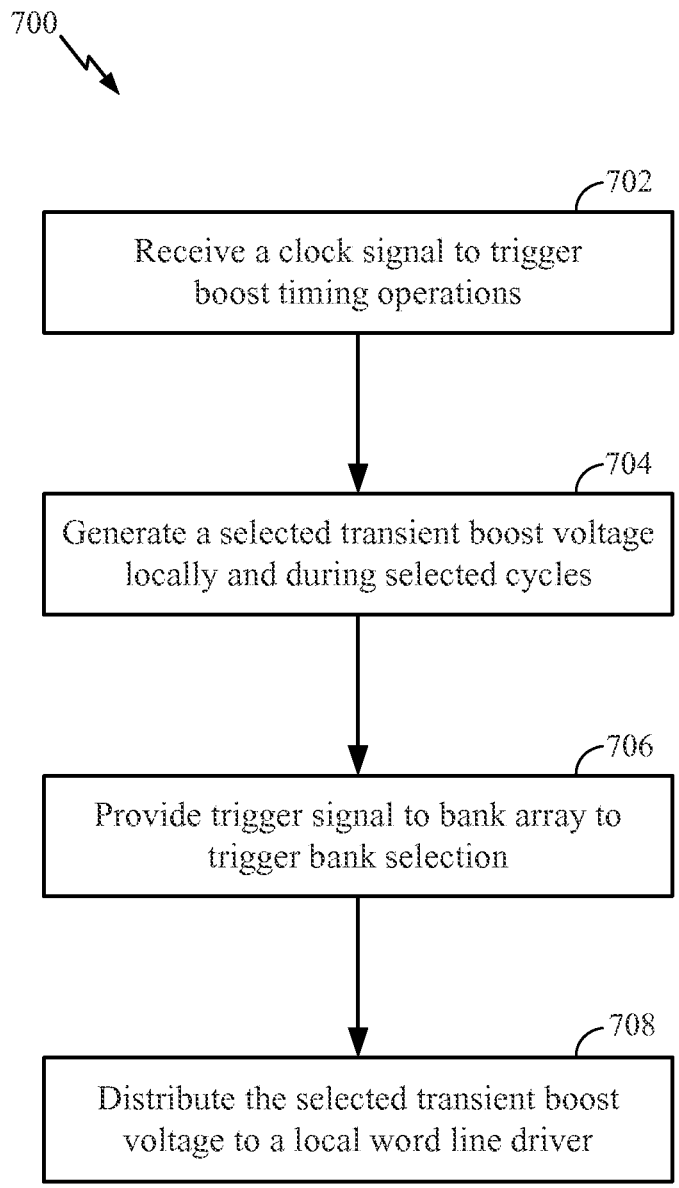
FIG. 7 illustrates one exemplary method for selective word-line boost on a memory cell.

FIG. 7 illustrates one exemplary method for selective word-line boost on a memory cell, wherein the method comprises receiving a clock signal to trigger boost timing operations 702. The boost timing operations are initiated in a boost timing generator and a boost clock signal is forwarded to a boost voltage generator. The voltage generator then generates a selected transient boost voltage 704 to be locally delivered and enabled during selected cycles of operation. The system 700 may then provide a trigger signal to bank array to trigger a bank selection for which a boost voltage signal is to be received 706. The transient boost voltage may then be distributed to local word-line drivers on a selected bank array 708.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but are to be accorded the widest scope consistent with the principles and novel features disclosed herein.

What is claimed is:

1. A multiport static random access memory (SRAM) array, comprising:
    a control logic circuit to receive a transient boost voltage; and
    a local word-line driver to apply the transient boost voltage to increase a selected portion of a word-line voltage following a word-line transition;
    wherein the control logic circuit includes a voltage generation circuit for each column of the SRAM memory array, the voltage generation circuit being configured to assert a transient boost voltage following a word-line transition.

2. The multiport SRAM memory array of claim 1, in which the control logic circuit comprises:
    a voltage generation circuit for each local word-line driver within each column of the SRAM memory array, the voltage generation circuit being configured to assert a transient boost voltage following a word-line transition.

3. The multiport SRAM memory array of claim 2, in which the voltage generation circuit comprises:
    a plurality of gate dielectric coupling capacitors;
    a charging section connecting the plurality of gate dielectric coupling capacitors in series, wherein the charging section is configured to receive at least one boost control signal and wherein the charging section is configured to adjust a boost level within a specified range for read and write operations.

4. The multiport SRAM memory array of claim 1, further comprising a boost circuit configured to generate the transient boost voltage at an array level and further configured to distribute the transient boost voltage to the local word-line drivers.

5. The multiport SRAM memory array of claim 1, in which the transient boost voltage is generated at the local word-line driver.

6. The multiport SRAM memory array of claim 5, wherein the transient voltage boost generation is controlled on a cycle basis.

7. The multiport SRAM memory array of claim 5, wherein the boost circuit is a power multiplexer (MUX).

8. The multiport SRAM memory array of claim 5, wherein the transient boost voltage comprises at least two output voltages configured to be distributed to the local-word line drivers.

9. The multiport SRAM memory array of claim 5, wherein the transient voltage boost generation is disabled when a bank array is not being accessed.

10. The multiport SRAM memory array of claim 5, wherein the boost circuit further comprises a first multiplexing circuit configured to select a bank array to be enabled for boost generation.

11. The multiport SRAM memory array of claim 5, wherein the boost circuit further comprises a second multiplexing circuit configured to determine whether or not to generate the transient boost voltage.

12. The multiport SRAM memory array of claim 11, wherein the second multiplexing circuit is operatively connected to the first multiplexing circuit, and wherein the input of the first multiplexing circuit includes a bank select signal and an inverted byte enable signal.

13. A method for selective word-line boost on a multiport SRAM memory array comprising:
receiving a clock signal to trigger boost timing operations;
generating a selected transient boost voltage;
providing a trigger signal to a bank array to trigger a bank array selection; and
distributing the selected transient boost voltage to the selected bank array.

14. The method of claim 13, further comprising:
receiving the transient boost voltage at a control logic circuit; and
applying the transient boost voltage to increase a selected portion of a word-line voltage supplied by a local word-line voltage driver, following a word-line transition.

15. The method of claim 13, further comprising asserting a transient boost voltage, following a word-line transition, for each column of the SRAM memory array.

16. The method of claim 13, further comprising configuring a voltage generation circuit to assert the transient boost voltage for each local word-line driver within each column of the SRAM memory array.

17. The method of claim 16, wherein configuring the voltage generation circuit further comprises:
coupling a plurality of gate dielectric capacitors in series; and
providing a charging section configured to receive at least one boost control signal and further configured to adjust a boost level within a specified range for read and write operations.

18. The method of claim 13, further comprising configuring a boost circuit to generate the transient boost voltage at an array level and further configuring the boost circuit to distribute the transient boost voltage to the local word-line drivers.

19. The method of claim 13, in which generating the transient boost voltage further comprises generating the transient boost voltage at the local word-line driver.

20. The method of claim 19, further including controlling the generating of the transient boost voltage on a cycle basis.

21. The method of claim 19, further comprising generating at least two output voltages configured to be distributed to the local word-line drivers.

22. The method of claim 19, further comprising disabling the transient voltage boost generation when a bank array is not being accessed.

23. The method of claim 19, further comprising providing a first multiplexing circuit configured to select a bank array to be enabled for boost generation.

24. The method of claim 19, further comprising providing a second multiplexing circuit configured to determine whether or not to generate the transient boost voltage.

25. The method of claim 24, further comprising operatively connecting the first and the second multiplexing circuits and having the input of the first multiplexing circuit include a bank select signal and an inverted byte enable signal.

26. A method for selective word-line boost on a multiport SRAM memory array comprising:
receiving a clock signal to trigger boost timing operations;
generating a selected transient boost voltage;
providing a trigger signal to a bank array to trigger bank array selection; and
distributing the selected transient boost voltage to a locally selected word-line driver.

27. A multiport static random access memory (SRAM) array, comprising:
means for receiving a clock signal to trigger boost timing operations;
means for generating a selected transient boost voltage;
means for providing a trigger signal to a bank array to trigger a bank array selection; and
means for distributing the selected transient boost voltage to the selected bank array.

28. The multiport SRAM memory array of claim 27, further comprising:
means for receiving the transient boost voltage at a control logic circuit; and
means for applying the transient boost voltage to increase a selected portion of a word-line voltage supplied by a local word-line voltage driver, following a word-line transition.

29. The multiport SRAM memory array of claim 27, further comprising means for asserting a transient boost voltage, following a word-line transition, for each column of the SRAM memory array.

30. The multiport SRAM memory array of claim 27, further comprising configuring a voltage generation circuit to assert the transient boost voltage for each local word-line driver within each column of the SRAM memory array.

31. The multiport SRAM memory array of claim 30, further comprising
means for coupling a plurality of gate dielectric capacitors in series; and
means for providing a charging section configured to receive at least one boost control signal and further configured to adjust a boost level within a specified range for read and write operations.

32. The multiport SRAM memory array of claim 27, further comprising means for configuring a boost circuit to generate the transient boost voltage at an array level and further configuring the boost circuit to distribute the transient boost voltage to the local word-line drivers.

33. The multiport SRAM memory array of claim 27 in which the means for generating the transient boost voltage further comprises means for generating the transient boost voltage at the local word-line driver.

34. The multiport SRAM memory array of claim 33, further comprising means for controlling the generating of the transient boost voltage on a cycle basis.

35. The multiport SRAM memory array of claim 33, further comprising means for generating at least two output voltages configured to be distributed to the local word-line drivers.

36. The multiport SRAM memory array of claim 33, further comprising means for disabling the transient voltage boost generation when a bank array is not being accessed.

37. The multiport SRAM memory array of claim 33, further comprising means for providing a first multiplexing circuit configured to select a bank array to be enabled for boost generation.

38. The multiport SRAM memory array of claim 33, further comprising means for providing a second multiplexing circuit configured to determine whether or not to generate the transient boost voltage.

39. The multiport SRAM memory array of claim 38, further comprising means for operatively connecting the first and the second multiplexing circuits and having the input of the first multiplexing circuit include a bank select signal and an inverted byte enable signal.

40. A multiport static random access memory (SRAM) array, comprising:
- means for receiving a clock signal to trigger boost timing operations;
- means for generating a selected transient boost voltage;
- means for providing a trigger signal to a bank array to trigger bank array selection; and
- means for distributing the selected transient boost voltage to a locally selected word-line driver.

* * * * *